United States Patent
May et al.

(10) Patent No.: US 9,678,546 B2
(45) Date of Patent: Jun. 13, 2017

(54) ENCLOSURE WITH MULTIPLE HEAT DISSIPATING SURFACES

(71) Applicant: PHOENIX CONTACT DEVELOPMENT AND MANUFACTURING, INC., Middletown, PA (US)

(72) Inventors: Stephen Dale May, Lebanon, PA (US); Scott David Lindstrom, Mountville, PA (US)

(73) Assignee: Phoenix Contact Development And Manufacturing, Inc., Middletown, PA (US)

( * ) Notice: Subject to any disclaimer, the term of this patent is extended or adjusted under 35 U.S.C. 154(b) by 0 days.

(21) Appl. No.: 15/091,944

(22) Filed: Apr. 6, 2016

(65) Prior Publication Data

US 2016/0299545 A1     Oct. 13, 2016

Related U.S. Application Data

(60) Provisional application No. 62/145,922, filed on Apr. 10, 2015.

(51) Int. Cl.
  *G06F 1/20*     (2006.01)
  *H05K 7/20*    (2006.01)
  *G06F 1/18*     (2006.01)

(52) U.S. Cl.
  CPC ............... *G06F 1/20* (2013.01); *G06F 1/183* (2013.01); *G06F 1/187* (2013.01); *G06F 1/188* (2013.01);

(Continued)

(58) Field of Classification Search
  CPC ....... H95K 7/20409–7/20427; H95K 7/20754; G06F 1/20; G11B 33/1426
  See application file for complete search history.

(56) References Cited

U.S. PATENT DOCUMENTS 5,510,954 A * 4/1996 Wyler ................. G06F 1/18
                                                              360/99.25
5,903,435 A    5/1999 Hsieh et al.
(Continued)

FOREIGN PATENT DOCUMENTS

DE    10311525 A1 * 9/2004  ............ G06F 1/182
DE    10311526 A1 * 9/2004  ............ G06F 1/16
DE    10311527 A1 * 9/2004  ............ G06F 1/181

*Primary Examiner* — Robert J Hoffberg
(74) *Attorney, Agent, or Firm* — McNees Wallace & Nurick LLC

(57) ABSTRACT

A fanless industrial computer enclosure dissipates heat generated by the hottest components on heat sinks dedicated to respective heat zones within the enclosure. Heat generated by the component that operates at the highest temperature in each heat zone is conducted to a heat sink on the exterior of the enclosure. Using a heat sink dedicated to each heat zone, heat generated by components such as an industrial computer, storage devices, power supply, or other electrical components, is dissipated on the outer surface of the enclosure to the surrounding ambient environment. Providing a low resistance heat conductive path from the hottest components to respective heat sinks to dissipate heat outside the enclosure from each heat zone creates an environment within the enclosure where disk drives do not exceed the specified upper operating temperature rating without regard to the operating temperature of other electrical components in the enclosure.

23 Claims, 11 Drawing Sheets

(52) U.S. Cl.
CPC ..... *H05K 7/20409* (2013.01); *H05K 7/20418* (2013.01)

(56) References Cited

U.S. PATENT DOCUMENTS

| | | | | |
|---|---|---|---|---|
| 6,278,610 B1 * | 8/2001 | Yasufuku | ............ | H05K 7/1431 165/185 |
| 6,320,746 B2 * | 11/2001 | Pei | ............ | G06F 1/20 174/15.2 |
| 6,434,000 B1 * | 8/2002 | Pandolfi | ............ | F25B 21/02 136/204 |
| 6,549,414 B1 * | 4/2003 | Tokuhara | ............ | G06F 1/20 165/104.33 |
| 6,771,495 B2 * | 8/2004 | Fujiwara | ............ | G06F 1/1616 361/679.34 |
| 7,133,284 B2 * | 11/2006 | Lee | ............ | G06F 1/20 361/697 |
| 7,136,286 B2 | 11/2006 | Chuang | | |
| 7,177,154 B2 * | 2/2007 | Lee | ............ | G06F 1/181 165/104.33 |
| 7,277,286 B2 * | 10/2007 | Lee | ............ | H05K 7/209 174/15.2 |
| 7,310,233 B2 * | 12/2007 | Bell | ............ | H05K 7/20509 165/185 |
| 7,447,017 B2 * | 11/2008 | Koo | ............ | G06F 1/20 165/104.21 |
| 7,532,474 B2 * | 5/2009 | Xue | ............ | H05K 7/20418 165/185 |
| 7,616,437 B2 * | 11/2009 | Chang | ............ | G06F 1/187 165/104.26 |
| 7,724,526 B2 * | 5/2010 | Hinze | ............ | H01L 23/367 165/104.33 |
| 7,773,378 B2 * | 8/2010 | Lin | ............ | G06F 1/20 361/690 |
| 7,990,720 B2 * | 8/2011 | Xu | ............ | G06F 1/20 165/80.3 |
| 8,031,464 B2 * | 10/2011 | Adkins | ............ | G06F 1/182 165/104.21 |
| 8,537,540 B2 * | 9/2013 | Landon | ............ | G06F 1/182 361/679.46 |
| 8,654,523 B2 * | 2/2014 | Adkins | ............ | G06F 1/182 165/104.21 |
| 8,842,437 B2 * | 9/2014 | Chang | ............ | G06F 1/181 165/185 |
| 8,911,244 B2 * | 12/2014 | Elison | ............ | H05K 7/20454 439/137 |
| 9,310,858 B2 * | 4/2016 | Yang | ............ | H05K 7/20 |
| 2004/0228093 A1 | 11/2004 | Lee | | |
| 2005/0286229 A1 * | 12/2005 | Ku | ............ | H01L 23/427 361/709 |
| 2010/0309626 A1 | 12/2010 | Xu et al. | | |
| 2012/0020017 A1 | 1/2012 | Kehret et al. | | |

* cited by examiner

ENCLOSURE WITH MULTIPLE HEAT DISSIPATING SURFACES

This application claims priority from and the benefit of U.S. Provisional Patent Application No. 62/145,922, entitled FANLESS PC WITH SATA DRIVE REMOTE FROM HEAT SOURCE, filed Apr. 10, 2015, which is hereby incorporated by reference.

FIELD OF THE INVENTION

The present invention relates to industrial environment enclosures for heat-generating electrical equipment, and more particularly, to enclosures that have more than one heat dissipating surface. Each heat dissipating surface dedicated to receiving heat from electrical equipment confined within a respective subsection of the enclosure.

BACKGROUND OF THE INVENTION

Electrical components, which include electronic equipment, are often enclosed in a housing suitable for the environment in which the components will operate. Such equipment may operate in applications where the environment is subject to high temperatures, vibration or dust. During operation of electrical components, some of the energy consumed is converted into heat. Electrical component manufacturers specify the temperature range over which electrical components are designed to operate. The operating temperature range should not be exceeded as the electrical components may not operate reliably outside of the specified temperature range or they may fail when operated outside the specified range. Heat-generating electrical equipment includes, but is not limited to, industrial computers, disk drives, power supplies, power converters, audio amplifiers, power amplifiers, personal computers, automotive computers and inverters.

Electrical components in some applications are cooled by a fan that circulates air within the housing. The moving air conducts heat away from hotter electrical components resulting in a more uniform air temperature within the housing. In other applications, air is drawn into the housing through openings in the housing by a fan exhausting heated air from the housing at a location that causes the incoming airflow to pass over electrical components to be cooled before the air is exhausted from the housing.

In other applications, a heat sink is provided for heat dissipation for multiple electrical components in a housing. In such an application, often one of the components generates more heat than other components or generates heat at a temperature that is higher than the temperature of other components served by the heat sink such that its operating temperature is higher than one or more other components coupled to the heat sink. Under these operating conditions, there can be heat recirculation where heat generated by a first component operating at a higher temperature is transferred to the heat sink to be dissipated, however, some of the heat is transferred from the heat sink to a second component ostensibly operating at a lower temperature thereby undesirably raising the operating temperature of the second component.

Disk drives have been a limiting factor in the thermal rating of an industrial computer. A disk drive usually reaches its upper limit operating temperature rating before other electric components reach their respective upper limit operating temperature within an enclosure housing an industrial computer.

BRIEF DESCRIPTION OF THE INVENTION

The present invention relates generally to increasing the operating temperature and vibration rating of a fanless industrial computer enclosure by dissipating heat generated by the hottest components on heat sinks dedicated to respective heat zones within the enclosure. Heat generated by the component or components that operate at the highest temperature in each heat zone is conducted to a heat sink on the exterior of the enclosure in which the components are housed. Using a heat sink dedicated to each heat zone, heat generated by components such as an industrial computer, storage devices, power supply, or other electrical components, is dissipated on the outer surface of the enclosure to the surrounding ambient environment. Providing a low resistance heat conductive path from the hottest components to respective heat sinks to dissipate heat from each heat zone outside the enclosure creates an environment within the enclosure where disk drives do not exceed the specified upper operating temperature rating without regard to the operating temperature of other electrical components in the enclosure.

Other features and advantages of the present invention will be apparent from the following more detailed description, taken in conjunction with the accompanying drawings which illustrate, by way of example, the principles of the invention.

DETAILED DESCRIPTION OF THE INVENTION

Figure 1:
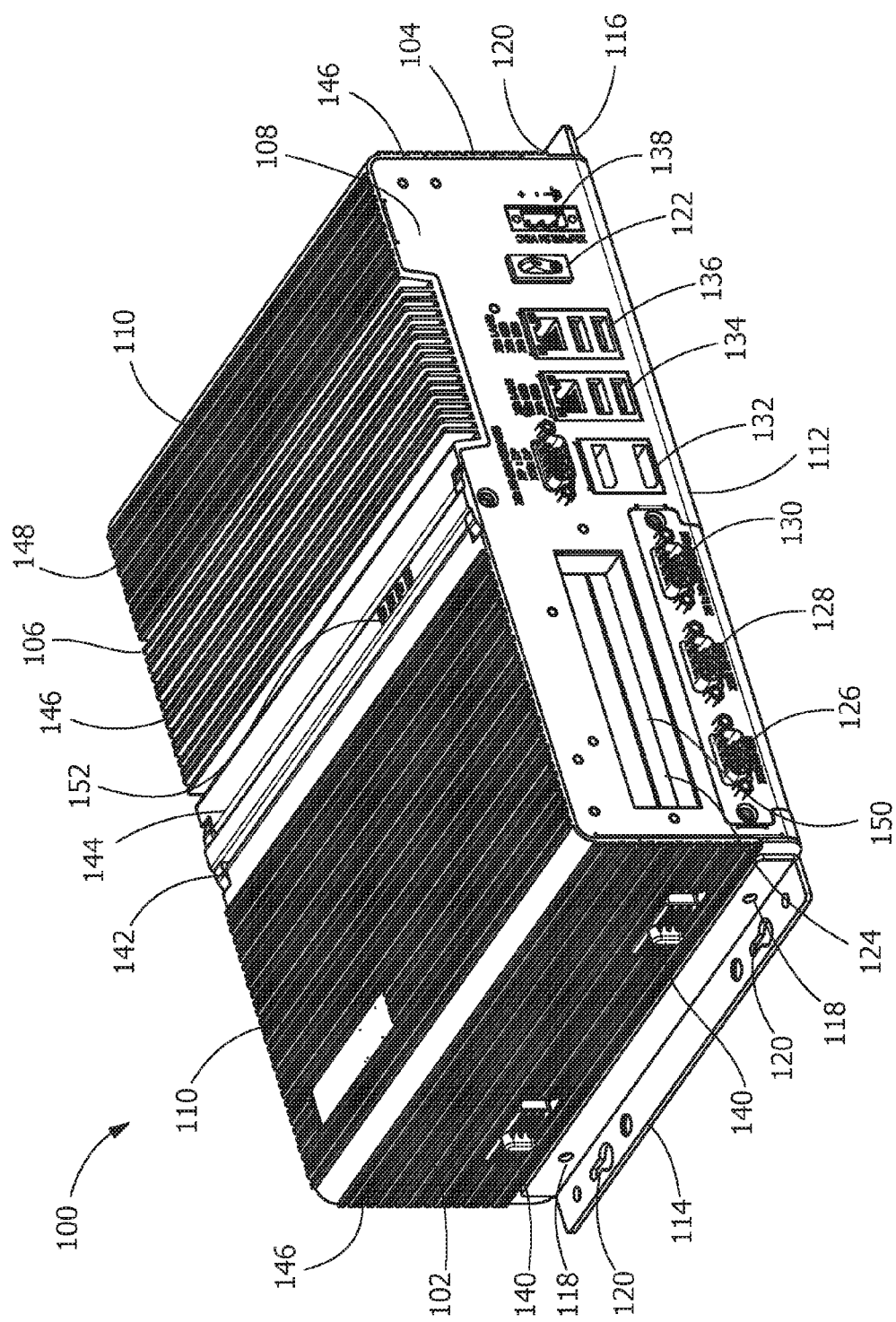
FIG. 1 is a perspective view of a fanless industrial computer enclosure.

FIG. 1 illustrates a perspective view of an enclosure 100 housing heat-generating electrical components for rugged industrial applications according to an embodiment of the invention. In some embodiments, enclosure 100 houses a central processing unit (CPU) such as an industrial computer. Other heat-generating electrical components that may be housed in enclosure 100 include, but are not limited to, an AC-DC power supply, a DC-DC converter, a DC-AC power inverter, a power amplifier, disk drives, and high gate count, high frequency-of-operation electronic circuits.

Enclosure 100 has first and second side walls 102, 104, top and bottom walls 106, 108 and front and rear walls 110, 112. First and second mounting brackets 114, 116 are secured to the first and second side walls 102, 104, respectively, such as by bolts 118. Mounting brackets 114, 116 have apertures 120 for mounting enclosure 100, such as on a horizontal or vertical surface, bookshelf or panel mount.

An on/off switch 122, a covered slot 124 for an optional PCI or PCIe board, and a variety of input-output (I/O) ports 126-138 provide signal and power interfaces between electrical components inside enclosure 100 and a power source and other electrical components outside of enclosure 100 from which signals are received and to which signals are provided. The number and type of input-outputs 126-138 may vary depending on the application. Typical power and input-output connections may include but are not limited to 24 volt DC, 0 volt and earth grounds, two gigabit Ethernet Local Area Network ports, multiple USB ports for USB accessories, two Display Port Graphics Interface ports to connect external displays, and a serial port supporting RS-232, RS-422, and RS-485 standards.

Enclosure 100 is fabricated of a heat conducting material, such as, but not limited to, aluminum. Enclosure 100 may have fins 146 on the exterior surface 148. The exterior surface 148 is visible between adjacent fins 146. Fins 146 extend outwardly from exterior surface 148, conduct heat away from exterior surface 148, and increase the surface area available for heat dissipation. The fins 146 increase the rate of heat transfer from the exterior surface 148 of enclosure 100 to the air surrounding the enclosure 100.

Between hinges 142 and 144 is a light emitting array 152 that provides status information. The information provided includes system indicators which may include the status of power, run, storage and errors.

Figure 2:
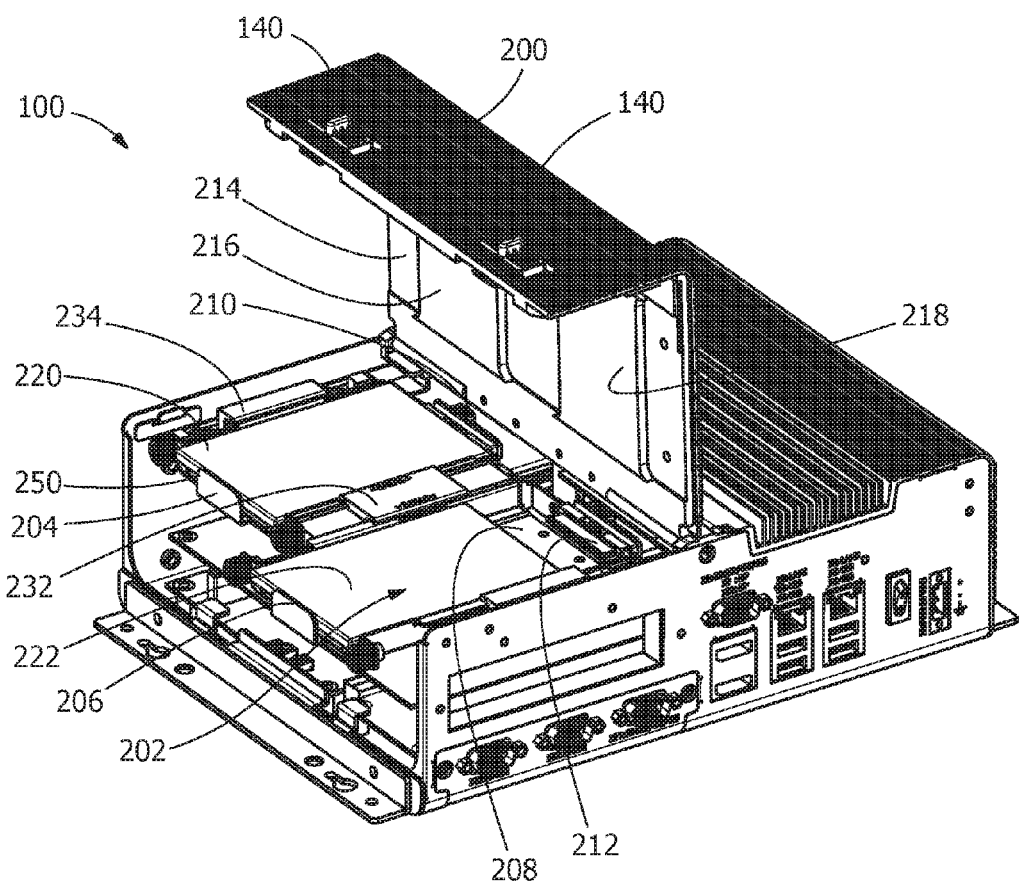
FIG. 2 is a perspective view of the enclosure with a first access panel in an open position revealing two disk drives.

FIG. 2 is a perspective view of enclosure 100 with a first access panel 200, which may be connected to enclosure 100 by a hinge 142, in an open position. Access panel 200 is released from a closed position by sliding slide latches 140 from a latched position which secures access panel 200 closed, to a released position from which access panel 200 can be opened. Access panel 200 provides easy, tool-less access to a first chamber 202 in which two disk drives 204, 206 are removably mounted. In some embodiments, disk drives 204, 206 are SATA (Serial Advanced Technology Attachment hard disk interface) drives. Drive 204 is illustrated secured in the operational position coupled to connector 210. Drive 206 is illustrated in a partially removed, or partially inserted, position decoupled from connector 212 and spaced a distance from connector 212. in some embodiments, beyond connectors 210, 212 beneath array 152 is a barrier that partially restricts air flow between the first heat zone 250 and the second heat zone 708 described below. Connectors 210, 212 are mounted on circuit board. Signals and power are coupled between and among various circuit boards by cables and power lines.

Secured to the inner surface 214 of first access panel 200 are two thermally conductive pads 216, 218. Alternatively, in other embodiments, the conductive pads 216, 218 could be secured to the upper surface 220, 222 of respective drives. With one or both of drives 204, 206 installed in the operational position, as access panel 200 is closed, thermally conductive pads 216, 218 slightly compress against the upper surface 220, 222 of respective drives 204, 206, while the drives are in a stationary position. During operation of the drives, heat produced by drives 204, 206 is conducted through respective upper surfaces 220, 222 and thermally conductive pads 216 and 218 to the inner surface 214 of access panel 200. The thermally conductive pads 216, 218 provide a thermally conductive path between the drives 204, 206 and the inner surface 214 of enclosure 100. Thermally conductive pads 216, 218 also compensate for any variations in spacing between the upper surface 220, 222 of respective drives 204 and 206 and the inner surface 214 of enclosure 100. The heat spreads over a portion of access panel 200 and is conducted through access panel 200 to the exterior surface 148 and fins 146 to be dissipated in the air surrounding enclosure 100.

With access panel 200 in an open position, drives 204, 206 are easily installed, or removed. Drives 204, 206 are positioned on mounting plate 208, aligned with respective integral guide slots 224 for drive 204 and integral guide slots 226 for drive 206.

The front edge 228, 230 (FIG. 3) of cantilevered spacer guides 232, 234 align with a leading edge 236, 238 (FIG. 12) of the guide slots 224, 226. During installation of drives 204, 206, drives 204, 206 are slid along guide slots 224, 226 toward the respective connector 210, 212. The guide slots and spacer guides maintain each drive 204, 206 aligned to couple with the respective connector 210, 212. When the drives are coupled to the respective connector in the operational position of the drives, the slots 224, 226 and spacer guides 232, 234 prevent movement of drives 204, 206 in the vertical direction in the perspective view of FIG. 3, thereby providing a more vibration-resistant design. The vertical height available for drives 204, 206 to slide under guides 232, 234 is the height of the drive plus a small clearance, substantially the height of the drives. Drives 204, 206 are secured in position by any known method, for example by screws 300 installed through flanges 304 into apertures in mounting plate 208.

During removal of drives 204 and 206, the screws 300 that secure the drives in the operational position coupled to respective connectors are removed, and the drives are slid along guide slots 224, 226 uncoupling the drives 204, 206 from respective connectors 210, 212 and moving the drives away from respective connectors 210, 212 until the trailing edge 242, 244 of each drive clears the respective spacer guide 232, 234. The drives can then be moved farther away from the respective connector 210, 212 in the same plane as if still constrained by the guide slots and spacer guides.

In some embodiments, the leading edges 236, 238 of the guide slots 224, 226, or the front edge 228, 230 of the spacer guides 232, 234, or both, are positioned closer to the respective connector 210, 212 than a length of the respective drive. In this manner, the distance a drive must be moved to be inserted or removed is less than the length of a drive.

Figure 3:
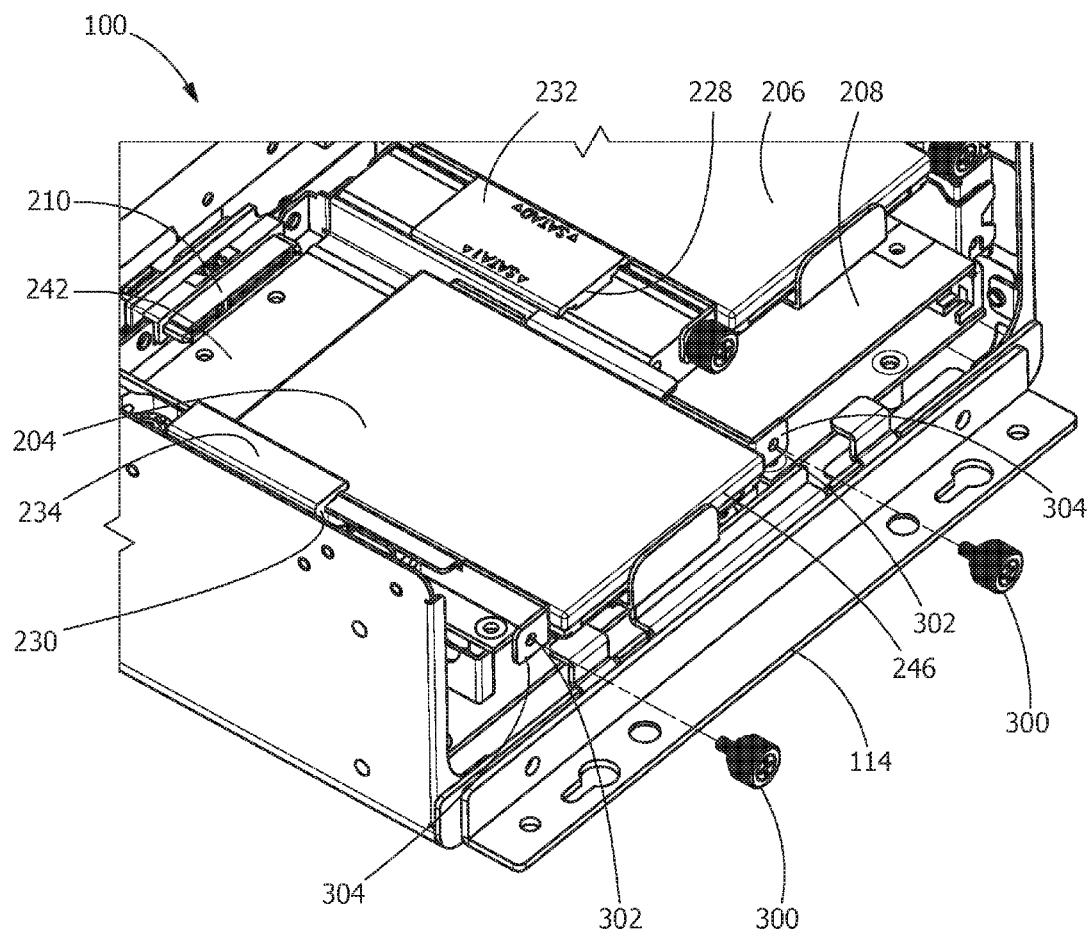
FIG. 3 is a perspective view of a partially removed, or inserted, disk drive.

FIG. 3 is a perspective view of a partially inserted, or partially removed, drive 204. Screws 300 are aligned with apertures 302 in flanges 304 and are secured in apertures in mounting plate 208 to secure each drive 204, 206 in the operational position.

Figure 4:
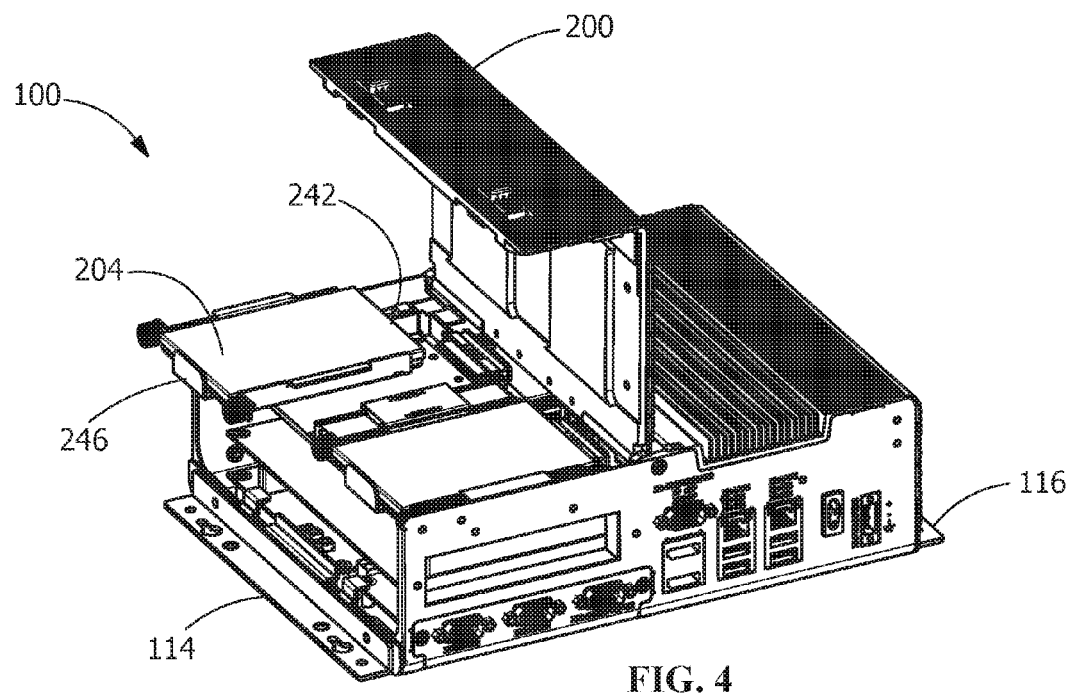
FIG. 4 is a perspective view of the enclosure illustrating one technique for inserting or removing a disk drive.

FIG. 4 is a perspective view of the enclosure 100 illustrating a partially removed, or inserted, drive 204. When sufficient space is available adjacent to enclosure 100, the drives can be removed, such as one at a time, by removing the screws that secure a drive in-place, sliding the drive along guide slots 224, 226 uncoupling the drives from the respective connector, and moving the drive away from the respective connector beyond where the drive clears the respective guide slots and spacer guides in the same plane as if still constrained by the guide slots and spacer guides.

Inserting the drives when sufficient space is available adjacent to enclosure 100 is achieved by reversing the above sequence. A drive is aligned with the respective guide slots and spacer guides, in a plane as if constrained by the guide slots and spacer guides. The drive is moved toward the respective connector into guide slots 220 and 222, then further toward the respective connector, constrained by guide slots 224, 226 coupling the drive with the respective connector. The drive is then secured in the operational position by screws 300.

Figure 5:
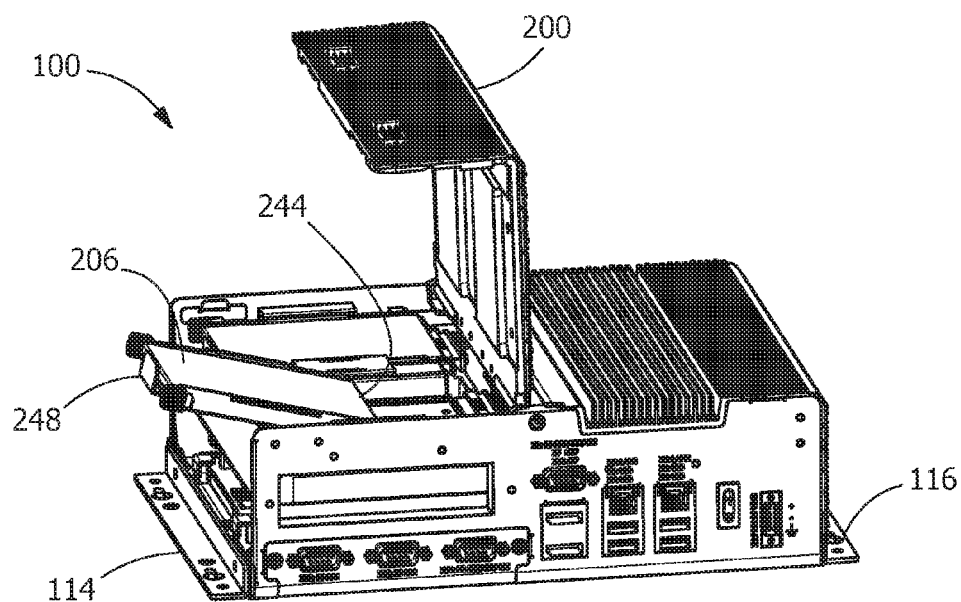
FIG. 5 is a perspective view of the enclosure illustrating an alternative technique for inserting or removing a disk drive.

Removing the drives 204, 206 when there is limited space available adjacent to enclosure 100 is achieved as illustrated in FIG. 5. When a drive has been decoupled from the respective connector and slid along the guide slots and the spacer guides until the trailing edge 242, 244 clears the spacer guides, the leading edge 246, 248 of the drive is rotated clockwise from the perspective of FIG. 5, away from mounting plate 208 as illustrated in FIG. 5 to remove the drive.

Inserting the drives 204, 206 when there is limited space available adjacent to enclosure 100 reverses the steps above. The drive is moved into first chamber 202 of enclosure 100 at an angle. The trailing edge 242, 244 of the drive is positioned near the guide slots and spacer guides, the drive is rotated, counter clockwise as illustrated from the perspective of FIG. 3, to align with the guide slots and spacer guides, then slid along the guide slots to couple with the respective connector and be secured in the operational position.

A slot 124, with cover 150, is an industry-standard slot provided for an optional PCI or PCIe board. The optional board provides its own cover to enclose the slot 124. A PCI or PCIe board is installed parallel to and underneath the mounting plate 208. The amount of heat generated is dependent on which card is inserted and the extent to which it is used.

The heat producing components in chamber 202 include the drives 204, 206 that are present and the PCI or PCIe board, if present. The power supply previously located beneath mounting plate 208 was moved as far away from the drives 204, 206 as possible, to another location within enclosure 100 that will be described below.

A first heat zone 250 provides a low resistance heat conductive path to transfer heat generated by the component or components that generate the most heat or the heat at the highest temperature in chamber 202 from where it is generated, to a dedicated, independent heat sink on a surface of enclosure 100, then dissipates the heat into ambient air surrounding enclosure 100 to prevent the air temperature in chamber 202 from exceeding the temperature rating of components within chamber 202.

The primary heat sources in chamber 202 are the drives that are present. Heat generated by drives 204, 206 is conducted from upper surfaces 220, 222 through thermally conductive pads 216, 218, if present, to the inner surface of 214 of door 200. Door 200 is fabricated of a heat conductive material. The heat distributes over at least a portion of door 200 and through door 200 to the exterior surface 148 and fins 146 where the heat is transferred to ambient air surrounding enclosure 100. Access panel 200, is a dedicated, independent heat sink for dissipating heat from disk drives 204, 206.

Figure 6:
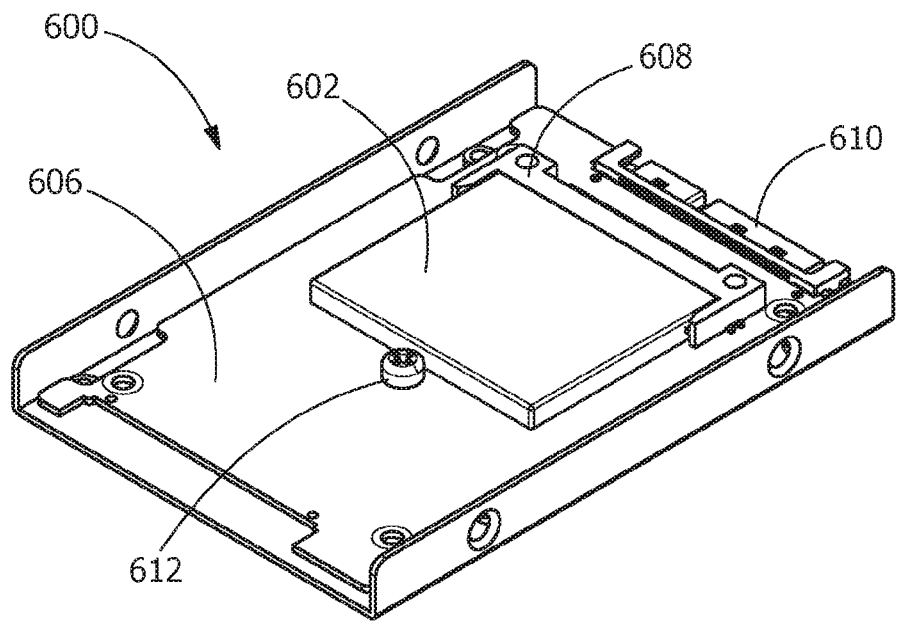
FIG. 6 is a perspective view of a mounting adapter for a solid state memory, including a solid state drive or other memory.

FIG. 6 is a perspective view of a mounting adapter 600 for a solid state memory 602. Solid state memory may include, but is not limited to, Compact Flash memory, Compact Fast memory, CFEX memory, Secure Digital memory card, and solid state drives. Circuit board 606 has a first connector 608 mounted thereon to which a solid state memory 602 can be coupled. Connector 608 also connects with conductive traces on circuit board 606 (not shown) which in turn are coupled to a second connector 610 that is complementary with connectors 204 and 206. An instantiation of mounting adapter 600 can be made to interface any selected form of memory with the existing connectors 204 and 206 to provide operative compatibility between the selected form of solid state memory 602 and other devices using the memory, including industrial computer 900. Fastener 612 is removably secured to circuit board 606 to prevent solid state memory 602 from decoupling from connector 608 unintentionally or due to vibration. A thermally conductive material, such as a thermally conductive pad or thermally conductive grease, is placed either on the top surface of the solid state memory 602 or on the inner surface 214 of first access panel 200 to assure a low resistance heat path between the solid state memory 602 and the first access panel 200 when the first access panel 200 is secured in a closed position.

Figure 7:
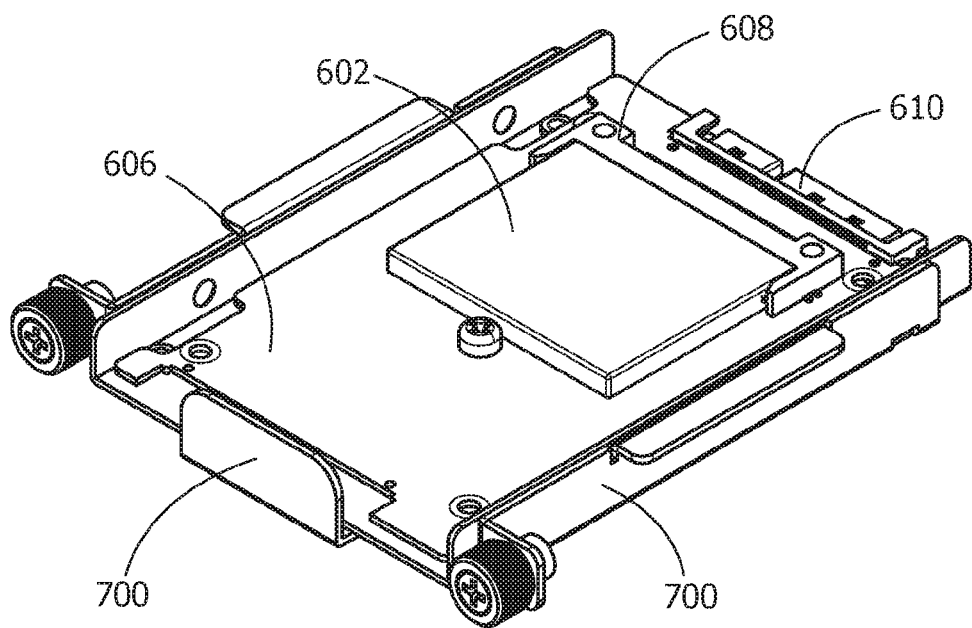
FIG. 7 is a perspective view of the mounting adapter in a tray for insertion into an operational position within the enclosure.

FIG. 7 is a perspective view of the mounting adapter 600 positioned in a tray 700 for insertion into an operational position with connector 610 mated with one of connectors 210 or 212 within the enclosure 100. Tray 700 is the same tray in which disk drives are placed prior to being installed in an operational position mated with one of connectors 210 or 212. Using a mounting adaptor 600 positioned in tray 700 provides any form of solid state memory 602 with the same form factor a disk drives 204, 206 described above with respect to FIGS. 2-5. Thus, solid state memory 602 as a component in the mounting adapter 600 positioned in a tray 700 and disk drives 204, 206 positioned in a tray 700 can be inserted into or removed from an operational position on the surface of the mounting plate in the same manner.

Figure 8:
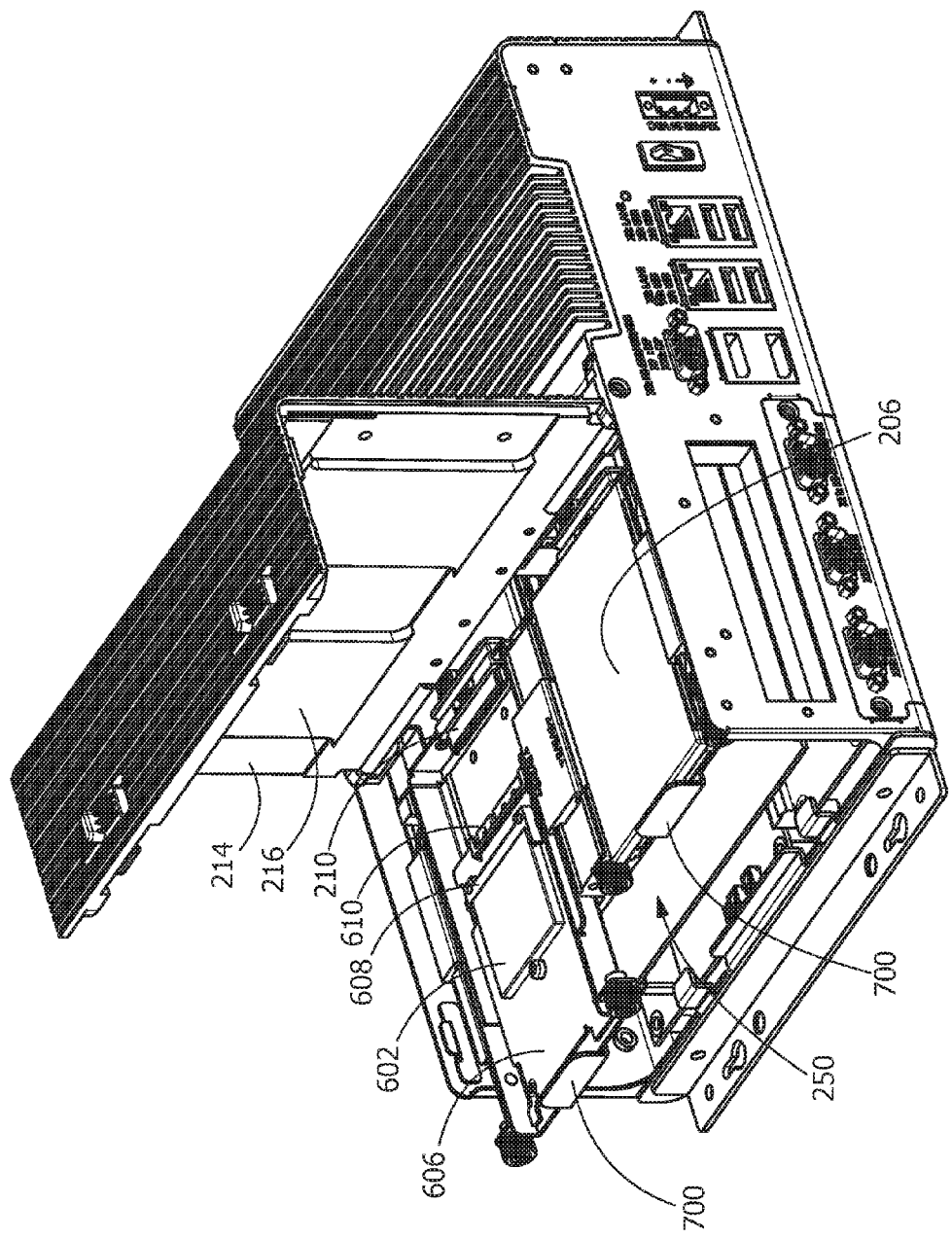
FIG. 8 is a perspective view of the enclosure with the first access panel in an open position revealing a hard disk drive and a solid state drive or other memory.

FIG. 8 is a perspective view of enclosure 100 with the first access panel 200 in an open position revealing a hard disk drive 206 and a solid state drive 602 or other memory positioned in heat zone 250.

Figure 9:
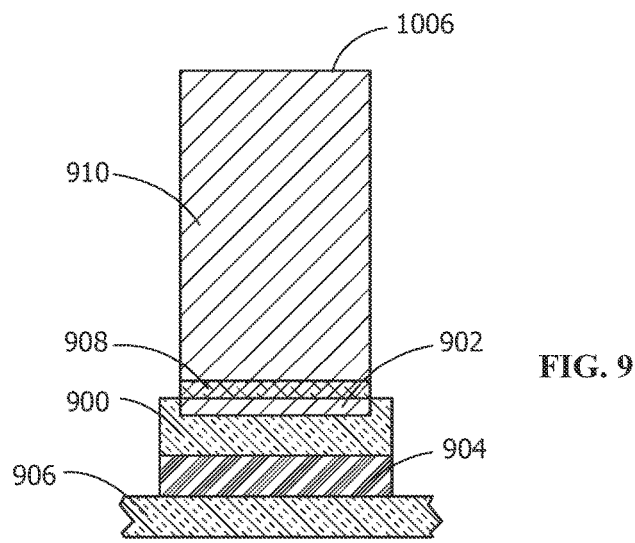
FIG. 9 is a simplified cross-sectional diagram of an industrial computer package having an integral heat spreader, mounted on a circuit board.

FIG. 9 is a simplified diagram of an industrial computer package 900 having an integrated heat spreader 902 on an upper surface. The computer package is in a socket 904 that is mounted on a circuit board 906. A thermally conductive pad 908 may be placed between the thermally conductive mass 910 and the integrated heat spreader 902. The thermally conductive mass 910, which may have a cross-sectional shape that replicates, or conforms to, the shape of the integrated heat spreader 902, is positioned on the integrated heat spreader 902, or on a thermally conductive pad 908, if present.

Figure 10:
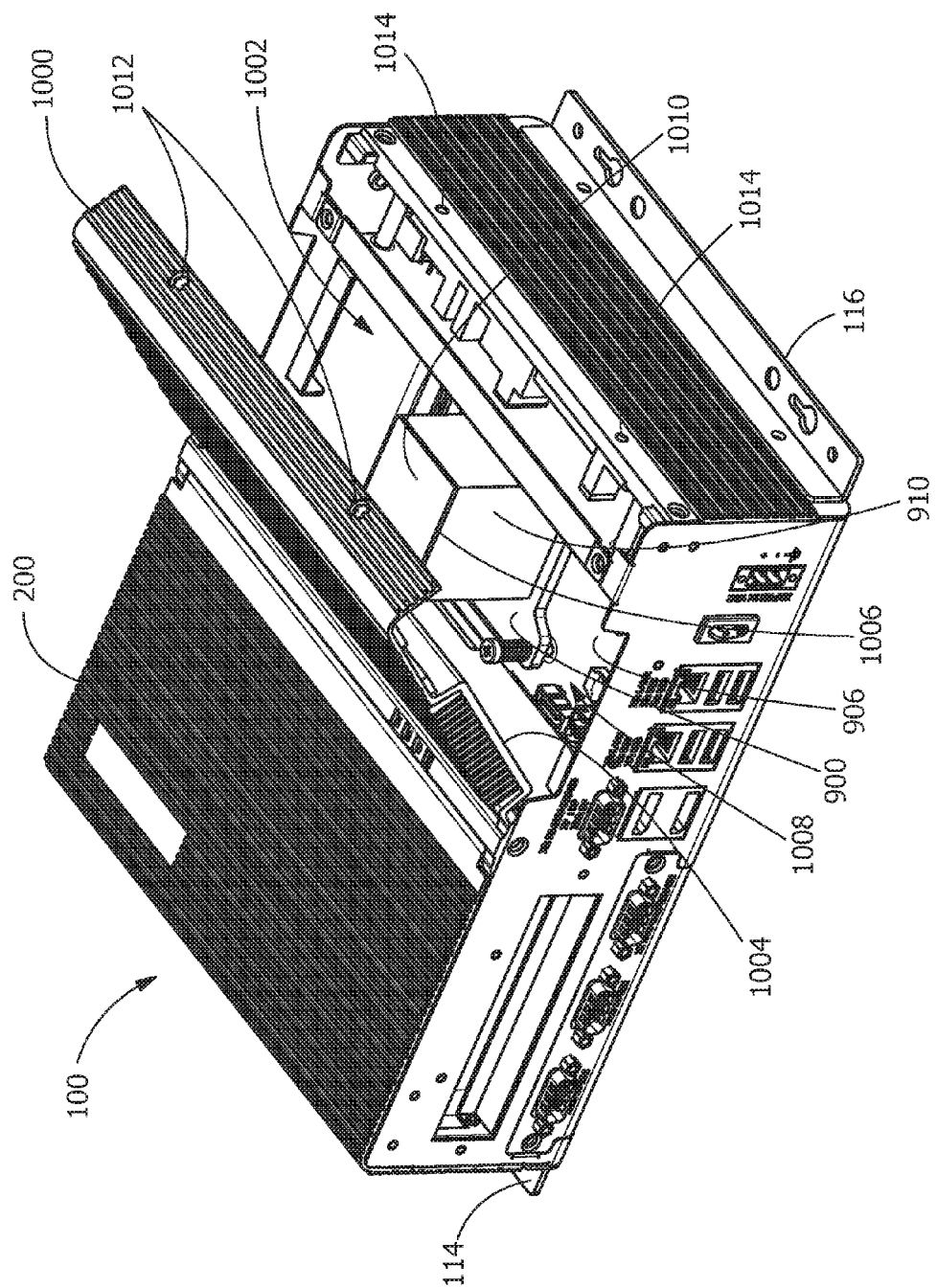
FIG. 10 is a perspective view of the enclosure with a second access panel in an open position revealing additional heat-generating electrical components.

FIG. 10 is a perspective view of enclosure 100 having a second access panel 1000, which may be connected to enclosure 100 by a hinge 144, in an open position revealing additional heat-generating equipment. Panel 1000 may be opened, for example, to set memory in chamber 1002. The industrial computer package 900, and thermally conductive mass 910 are visible in chamber 1002. The height of thermally conductive mass 910 is a height such that the upper surface 1006 engages the inner surface 1004 of access panel 1000 when panel 1000 is closed. The upper surface 1006 of thermally conductive mass 910 transfers heat to the inner surface 1004 of access panel 1000 when access panel 1000 is closed. The heat distributes over at least a portion of access panel 1000 and passes through access panel 1000 to the exterior surface 148 and fins 146 where the heat is transferred to ambient air surrounding enclosure 100. In some embodiments, the fins 146 on the exterior surface of access panel 1000 are longer than other fins on enclosure 100 which provides more heat transfer area outside of enclosure 100, and concomitantly, when the distal edges of the fins are maintained in a plane, shifts inward the inner surface of the portion of access panel 1000 with the longer fins thereby reducing the length of the heat transfer path within enclosure 100, and correspondingly, the height of thermally conductive mass 910. A thermally conductive material, such as a thermally conductive pad or thermally conductive grease, may be secured to the inner surface 1004 of access panel 1000 or to the upper surface 1006 of thermally conductive mass 910. A thermally conductive pad 1010 is illustrated in FIG. 10. One skilled in the art would know how to secure a thermally conductive pad to a surface. The thermally conductive pad is positioned such that when access panel 1000 is closed, the thermally conductive pad or grease, if present, slightly compresses against the upper surface 1006 of thermally conductive mass 910. In some embodiments a thermally conductive pad is secured to inner surface 1004 rather than to upper surface 1006. With access panel 1000 closed, bolts, not shown, pass through apertures 1012 then through apertures 1014 to secure access panel 1000 in the closed position.

A second heat zone 1008 provides a, low resistance heat transfer path to transfer heat generated, by the component or components that generate the most heat or the heat at the highest temperature, in chamber 1002 from where it is generated, to a heat sink on a surface of enclosure 100, then dissipate the heat into ambient air surrounding enclosure 100 to prevent the air temperature in chamber 1002 from exceeding the temperature rating of components within chamber 1002.

The second heat zone 1008 transfers heat generated in the industrial computer package 900 as presented at the integrated heat spreader 902 to the thermally conductive mass 910, through a thermally conductive pad 908, if present. The thermally conductive mass 910, which is a low heat resistance conductor, transfers the heat to the inner surface 1004 of access panel 1000, through a thermally conductive pad, if present. Thermally conductive mass 910 can be fabricated from any low resistance heat conductive material. In some embodiments, the thermally conductive mass is a solid block of copper. In other embodiments, thermally conductive mass 910 is a solid block of aluminum. Other electrical components necessary for an industrial computer system, including memory, are also mounted on circuit board 906 in second heat zone 1008. The industrial computer system includes a processor that is a high frequency of operation integrated circuit. Access panel 1000, is a heat sink for dissipating heat from the industrial computer package 900.

Figure 11:
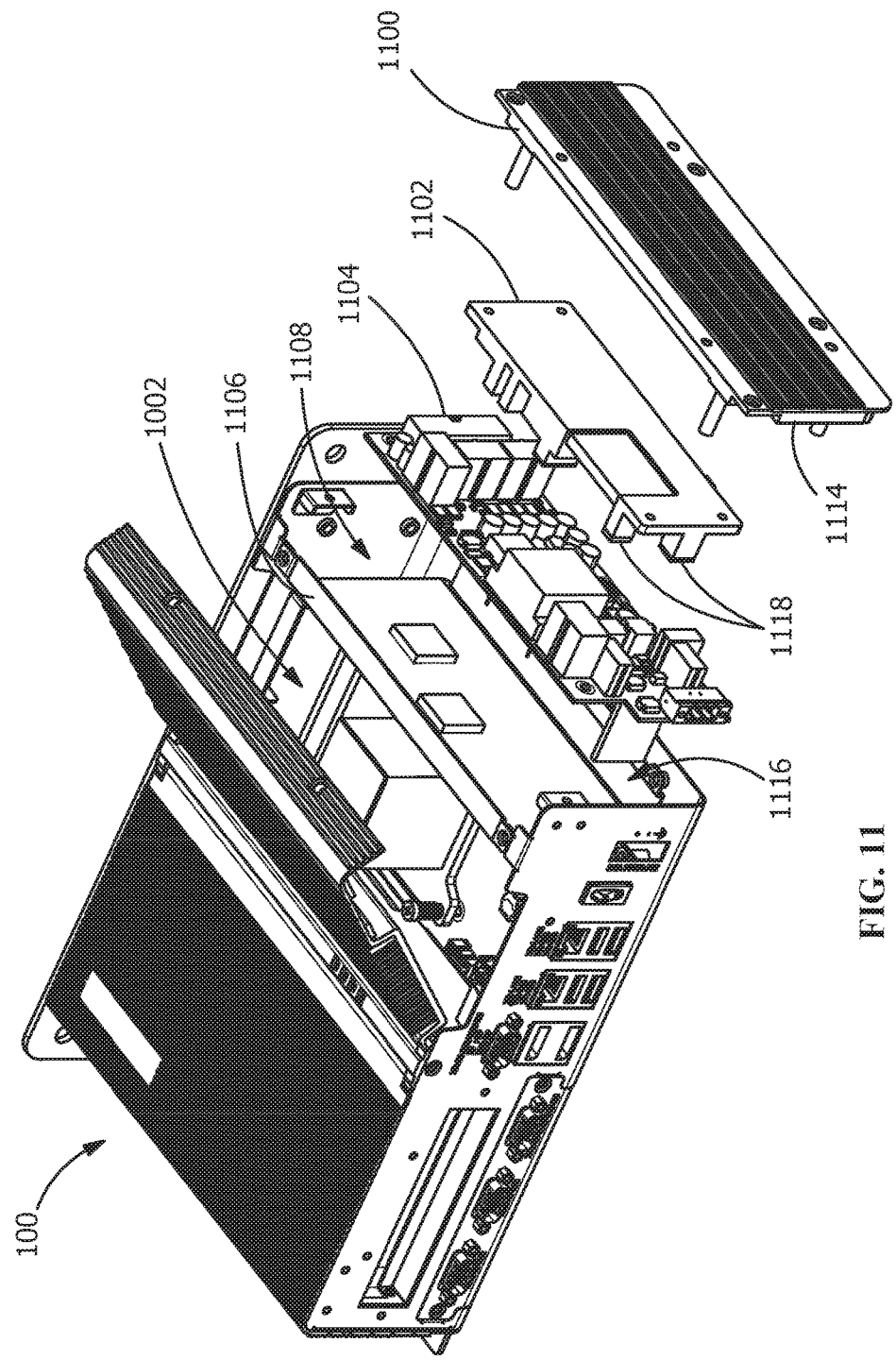
FIG. 11 is an exploded perspective view of a power supply including a third access panel in an open position.

FIG. 11 is an exploded perspective view of a power supply 1104, including a third access panel 1100 in an open position. Power supply 1104, thermally conductive mass 1102, and access panel 1100 bolt together to form a power supply module that slides into a chamber 1108 of enclosure 100. Access panel 1100, which also serves as a heat sink, forms sidewall 104. Panel 1106 provides a partial barrier between chamber 1002 which houses the industrial computer 900 and chamber 1108 which houses the power supply 1104. As mentioned above, the power supply 1104, which is coupled to other components via cable connections, was moved from beneath the disk drives to a location in enclosure 100 as far from the disk drives 204, 206 as practical. Power supply 1104 was redesigned to fit on a vertical circuit board in the available space and to have a dedicated, independent heat sink, access panel 1100. Power supply 1104.

A third heat zone 1116 includes structure to conduct heat from the electrical component or components that generate the most heat or the heat at the highest temperature in the power supply 1104 through a low resistance, heat conductive path to an independent heat sink on a surface of enclosure 100, transfer the heat through enclosure 100, and dissipate the heat into ambient air surrounding enclosure 100.

Thermally conductive mass 1102 is a thermally conductive material made to conduct heat from specific power supply components that generate the most heat or the heat at the highest temperature in the power supply 1104 to the inner surface 1114 of access panel 1100. Thermally conductive pads 1118, or thermally conductive grease, are used between power supply components and the thermally conductive mass 1102 as well as between the thermally conductive mass 1102 and the inner surface 1114 of panel 1100 to assure a continuous, low heat resistant path is established between the power supply components and panel 1100, which also serves as a heat sink. The compression provided by power supply 1104, thermally conductive mass 1102, and panel 1100 being bolted together to form a module also facilitates efficient heat transfer between the electrical components and the thermally conductive mass 1102 as well as between the thermally conductive mass 1102 and inner surface 1114 of access panel 1100. The power supply components transfer heat to the thermally conductive mass 1102 which in turn transfers heat to the inner surface 1114 of access panel 1100 when access panel 1100 is closed and power supply 1104 is operating. The heat distributes over at least a portion of access panel 1100 and passes through access panel 1100 to the exterior surface 148 and fins 146, if present, where the heat is transferred to ambient air surrounding enclosure 100. A thermally conductive pad or thermally conductive grease, not visible in FIG. 11, may positioned between thermally conductive mass 1102 and to the inner surface 1114 of access panel 1100 in the same manner as described elsewhere herein. The thermally conductive pad or grease is positioned such that when access panel 1100 is closed, the thermally conductive pad or grease, if present, facilitates heat transfer between the thermally conductive mass 1102. Access panel 1100, which is also sidewall 104, is a dedicated, independent heat sink for dissipating heat from the power supply 1104 in the third heat zone 1116.

Figure 12:
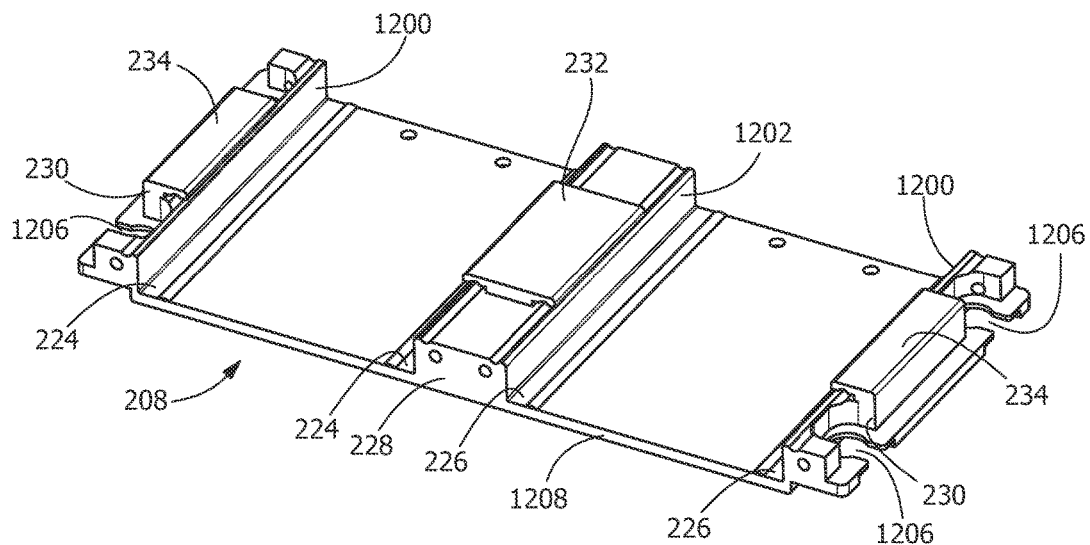
FIG. 12 is a perspective view of a rigid mounting plate employed to reduce harmonic resonance.

FIG. 12 is a perspective view of a rigid mounting plate 208 employed to reduce harmonic resonance. In some embodiments, the rigid plate is an extruded aluminum plate, but the plate is not limited to being extruded or being made of aluminum. Harmonic resonances experienced in sinusoidal shock and vibration tests were eliminated by changing from a stamped metal support for the disk drives 204, 206 to a rigid mounting plate 208. The guide slots 224 and 226 extend along outer ribs 1200 and inner rib 1202. Ribs 1200 and 1202 provide rigidity and prevent the mounting plate 208 from flexing when secured in enclosure 100 with disk drives 204, 206 mounted thereon. Mounting plate 208 can be secured in any manner known, such as by bolts received in slots 1206. Cantilevered spacer guides 232, 234 are formed as part of mounting plate 208. The spacer guides 232, 234 are recessed from the forward edge 1208 of mounting plate 208 so the drives can be inserted or removed without sliding the full depth of the mounting plate 208.

Figure 13:
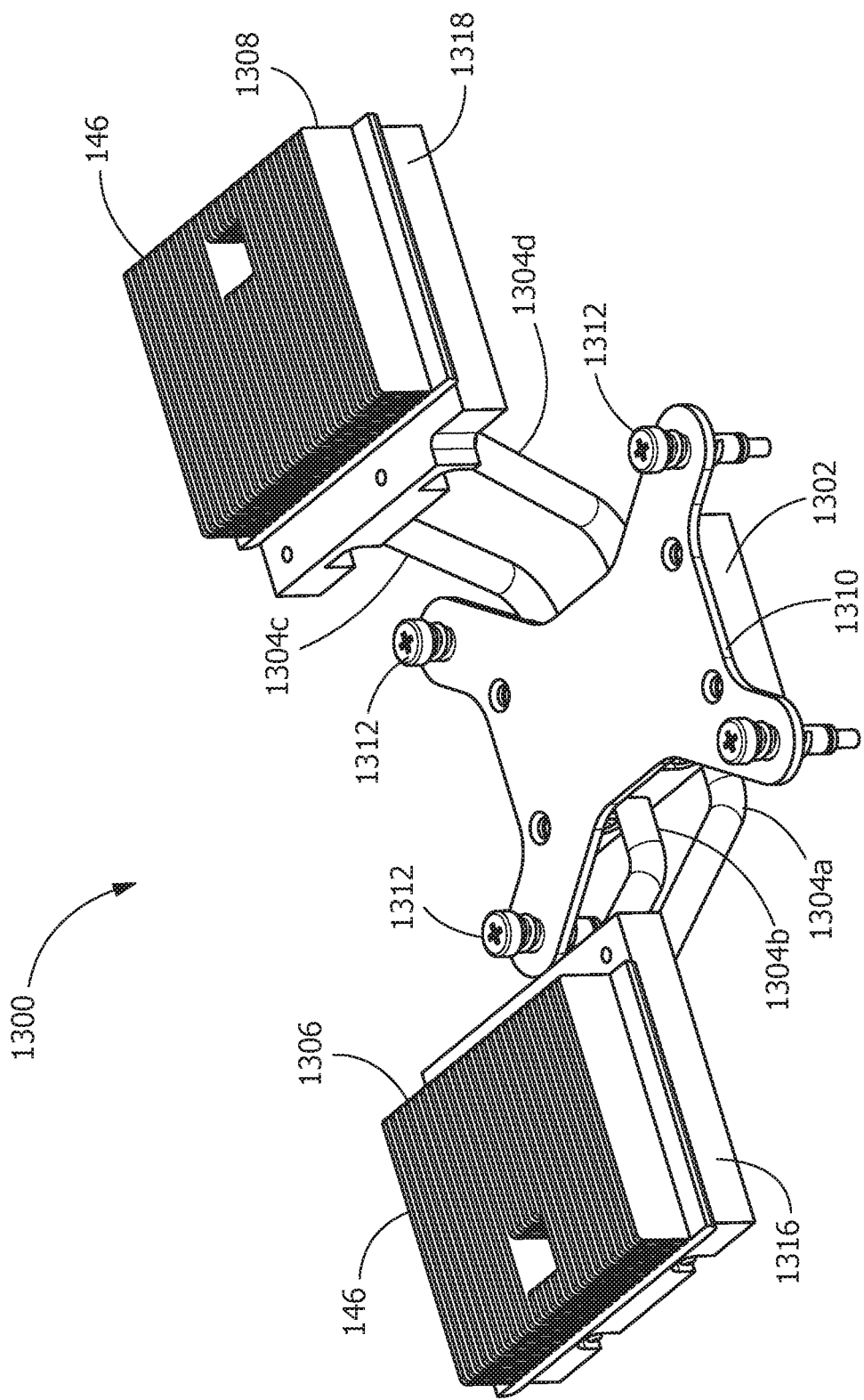
FIG. 13 is an alternate embodiment enclosure with a heat pipe heat conductive path.

FIG. 13 is a perspective view of a heat pipe assembly 1300 and mounting bracket 1310. A heat pipe includes a sealed tube partially filled with a working fluid. The mass of working fluid is determined so the heat pipe contains both vapor and liquid over an operating temperature range by the temperature of the heat source and the heat sink. Heat pipes have a relatively high transfer rate and no mechanical moving parts.

Figure 14:
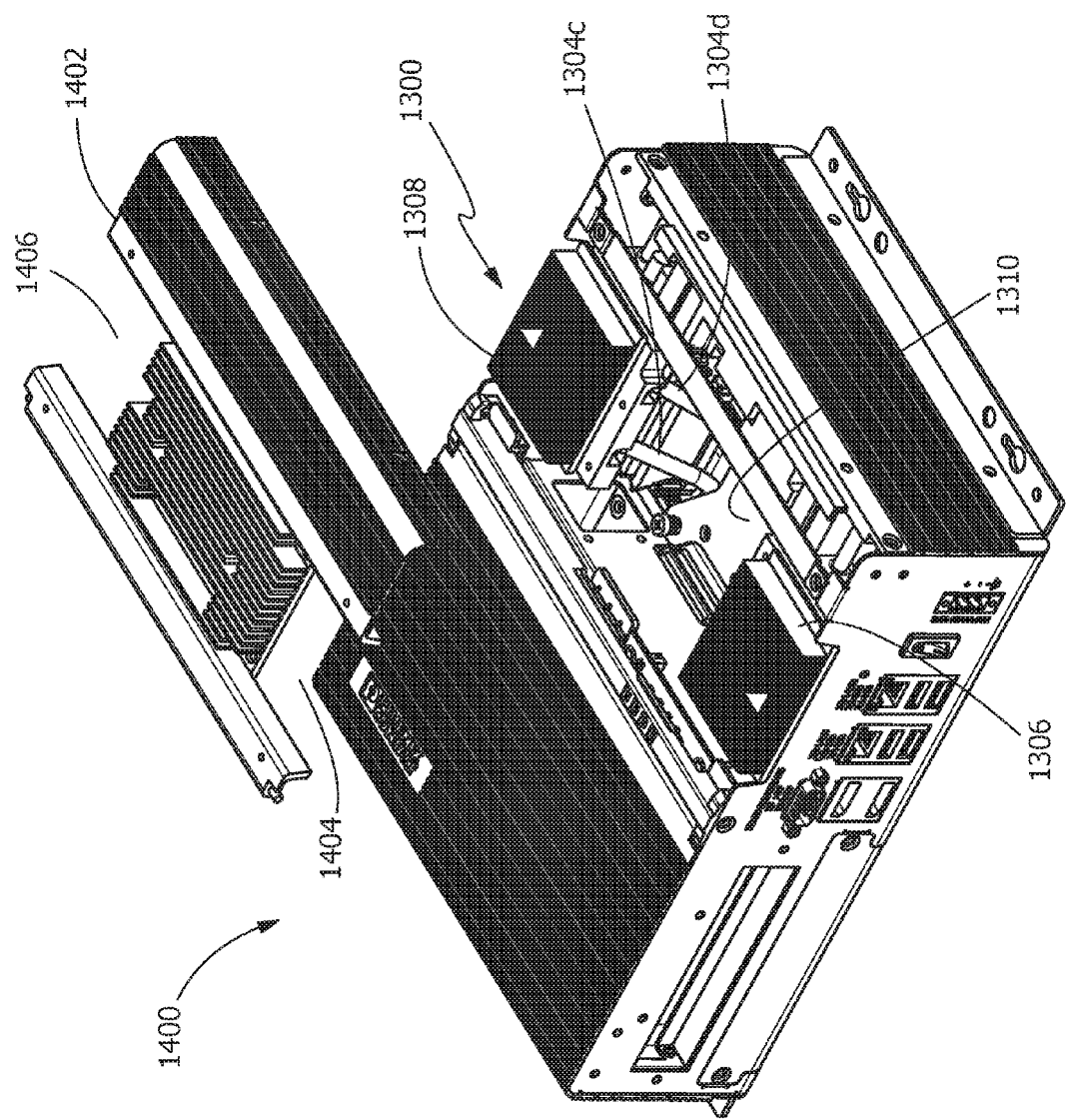
FIG. 14 is a perspective view of the heat pipe assembly and mounting bracket.

Heat pipe assembly 1300 includes a mounting block 1302 in which the lower end of the four heat pipes 1306*a*-*d* are secured. Heat pipes 1304*a*-*d* may be, but are not limited to being, interdigitated in parallel slots in mounting block 1302. Each heat pipe 1304*a*-*d* extends outward from an edge of the mounting block 1302 then angles upward and angles downward to be horizontal, substantially parallel to mounting block 1302. Heat pipes 1304*a* and *b* engage and are secured in the bottom of condenser 1306 for efficient heat transfer therebetween. Similarly, and heat pipes 1304*c* and *d* engage and are secured in the bottom of condenser 1308 for efficient heat transfer therebetween. Condensers 1306 and 1308 may have a respective heat transfer block 1316 and 1318 made of a thermally conductive material to which the condenser ends of heat pipes 1304 are secured. Heat pipes 1304*a* and *b* extend outwardly from a first side of mounting block 1304. Heat pipes 1304*c* and *d* extend outwardly from a second, opposite, side of mounting block 1304. Mounting bracket 1310 has screws 1312 to secure the heat pipe assembly in engagement with the integrated heat spreader. FIG. 14 is a perspective view of an alternate embodiment enclosure 1400 with a heat pipe assembly as a heat conduction path. In the alternate embodiment enclosure 1400 a heat pipe assembly 1300 transfers heat generated by an electrical component to a heat sink. The first metal mass 910 illustrated in FIG. 11 is replaced in the embodiment of FIG. 14 by the heat pipe assembly 1300 which transfers heat generated by the by the industrial computer 900 to the inner surface of enclosure 1400, and then to the ambient air surrounding enclosure 1400. Condensers 1306 and 1308 form a part of enclosure 1400. Screws 1312 assure the bottom surface of mounting block 1302 is pressed against the surface of heat spreader 902 on the upper surface of the industrial computer 900 to provide efficient heat transfer between the heat spreader 902 and the mounting block 1302.

Second access panel 1402 has cut-outs 1404 and 1406 to complement the shape of respective condensers 1306 and 1308. When access panel 1402 is hinged, upon being opened and closed, the panel 1402 clears condensers 1306 and 1308. Depending where the industrial computer 900 is located within heat zone, the location of and shape of the condensers 1306 and 1308 may vary. Furthermore, the length and angle of inclination of heat pipes 1304*a*-*d* may also vary.

While the invention has been described with reference to one or more embodiments, it will be understood by those skilled in the art that various changes may be made and equivalents may be substituted for elements thereof without departing from the scope of the invention. For example, while an embodiment with three heat zones, three heat paths and three independent heat sinks has been disclosed, the invention is not limited thereto. Other numbers of heat zones, heat paths and heat sinks are contemplated within the scope of the invention. Furthermore, while the heat sinks in some of the disclosed embodiments are panels that are removable or are hinged elements, the invention is not limited thereto. The heat sinks could be non-movable portions of the enclosure surface. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. In addition, all numerical values identified in the detailed description shall be interpreted as though the precise and approximate values are both expressly identified.

What is claimed is:

1. A system comprising:
   an enclosure having an interior space divided into at least three chambers for housing electrical components that generate heat when operating, the enclosure comprising a plurality of heat sinks, the plurality of heat sinks comprises a first heat sink, a second heat sink and a third heat sink;
   the electrical components comprise:
   at least one heat generating storage device positioned in a first chamber of the at least three chambers, each of the at least one storage device having a heat conductive surface, each of the at least one storage device positioned in the enclosure with the heat conductive surface of each engaging the first heat sink forming at least one first heat conductive path;
   a processor positioned in a second chamber of the at least three chambers, the processor having an integrated heat spreader and a second heat conductive path between the integrated heat spreader and the second heat sink;
   a power supply positioned in a third chamber of the at least three chambers, the power supply having a third heat conductive path between the power supply and the third heat sink; and
   a barrier panel separating the second chamber and the third chamber,
   wherein the first chamber, the second chamber, the barrier panel, the third chamber and third heat sink are sequentially arranged.

2. The system of claim 1 wherein the first heat sink comprises a first access panel, the heat conductive surface of each of the at least one storage device engaging an inner surface of the first access panel, whereby each of the at least one storage device is capable of being positioned in an operational position before the inner surface of the first access panel engages the heat conductive surface of each of the at least one storage device.

3. The system of claim 2 further comprising a thermally conductive material positioned between the heat conductive surface of a respective one of the at least one storage device and the inner surface of the first access panel forming a part of a corresponding one of the at least one first heat conductive path to facilitate heat transfer therebetween.

4. The system of claim 1 wherein the at least one storage device is a plurality of heat generating storage devices.

5. The system of claim 1, further comprising a rigid mounting plate secured in the enclosure, each of the at least one storage device mounted on a surface of the mounting plate.

6. The system of claim 5, wherein the mounting plate further comprises guide slots for positioning a respective one of the at least one storage device as the respective one of the at least one storage device is inserted into or removed from an operational position on the surface of the mounting plate.

7. The system of claim 5, wherein the mounting plate further comprises spacer guides positioned a distance from the surface of the mounting plate on which the respective one of the at least one storage device is positioned, the distance being substantially a same thickness as the respective one of the at least one storage device, the spacer guides preventing the respective one of the at least one storage device from moving away from the surface of the mounting plate.

8. The system of claim 7, wherein the spacer guides extend toward a front edge of the mounting plate less than a length of the respective one of the at least one storage device, wherein a distance the respective one of the at least one storage device is moved to be installed or removed is less than the length of the respective one of the at least one storage device.

9. The system of claim 1 wherein a memory component of each of the at least one heat generating storage device is selected from a group consisting of a solid state drive, a hard disk drive, a SATA drive, a Compact Flash memory, a CFAST memory, a CFEX memory, and a SD memory.

10. The system of claim 1, wherein the second heat conducting path between the integrated heat spreader and the second heat sink comprises a heat conductive mass.

11. The system of claim 10, wherein a material from which the heat conductive mass is fabricated is selected from a group consisting of copper and aluminum.

12. The system of claim 10, wherein a cross section of the heat conductive mass conforms to a shape of the integrated heat spreader.

13. The system of claim 10, further comprising a thermally conductive material positioned between the second heat sink and a surface of the heat conductive mass to facilitate heat transfer therebetween forming a part of the second heat conductive path.

14. The system of claim 10, wherein the second heat sink comprises a second access panel.

15. The system of claim 1, wherein at least one of the first, second or third heat conducting paths between a respective one of the electrical components and at least one of the heat sinks comprises a heat pipe.

16. The system of claim 15, wherein the second heat conducting path between the integrated heat spreader and the second heat sink comprises the heat pipe.

17. The system of claim 15, wherein the heat pipe comprises a plurality of heat pipes.

18. The system of claim 1, wherein the third heat conducting path between the power supply and the third heat sink comprises a thermally conductive mass.

19. The system of claim 18, wherein a material from which the thermally conductive mass is fabricated is selected from a group consisting of copper and aluminum.

20. The system of claim 19, further comprising a thermally conductive material positioned between the third heat sink and a surface of the thermally conductive mass to facilitate heat transfer therebetween forming a part of the third heat conductive path.

21. The system of claim 18, wherein the third heat sink comprises a third access panel, a surface of the thermally conductive mass engaging an inner surface of the third access panel.

22. The system of claim 21, further comprising a thermally conductive material positioned between the inner surface of the third access panel and a surface of the thermally conductive mass forming a part of the third heat conductive path.

23. A method of cooling an enclosure having electrical components in an interior thereof, comprising: dividing the interior of the enclosure into a plurality of N heat zones, N is an integer ≥3; and providing a respective heat conduction path from a respective one of the electrical components in each of the heat zones to a corresponding one of dedicated, independent heat sinks on a surface of a portion of the enclosure, whereby when the respective one of electrical components is operating, heat generated by the respective one of electrical components is transferred to the corresponding one of the dedicated, independent heat sinks, the dedicated, independent heat sinks comprises a first heat sink, a second heat sink and a third heat sink;

a first of the respective one of the electrical components comprises at least one heat generating storage device positioned in a first zone of the at least three heat zones, each of the at least one storage device having a heat conductive surface, each of the at least one storage device positioned in the enclosure with the heat conductive surface of each engaging the first heat sink forming at least one first heat conductive path;

a second of the respective one of the electrical components comprises a processor positioned in a second zone of the at least three heat zones, the processor having an integrated heat spreader and a second heat conductive path between the integrated heat spreader and the second heat sink;

a third of the respective one of the electrical components comprises a power supply positioned in a third zone of the at least three heat zones, the power supply having a third heat conductive path between the power supply and the third heat sink; and a barrier panel separating the second zone and the third zone, wherein the first zone, the second zone, the barrier panel, the third zone and third heat sink are sequentially arranged.

* * * * *